United States Patent
Eguchi et al.

(10) Patent No.: US 7,902,559 B2
(45) Date of Patent: Mar. 8, 2011

(54) LIGHT EMITTING DEVICE AND ELECTRONIC APPARATUS

(75) Inventors: Tsukasa Eguchi, Matsumoto (JP); Hiroaki Jo, Sawa (JP); Eiji Kanda, Suwa (JP); Toshiyuki Kasai, Okaya (JP); Atsushi Ito, Shiwasuka-machi (JP)

(73) Assignee: Seiko Epson Corporation, Tokyo (JP)

( * ) Notice: Subject to any disclaimer, the term of this patent is extended or adjusted under 35 U.S.C. 154(b) by 77 days.

(21) Appl. No.: 12/269,427

(22) Filed: Nov. 12, 2008

(65) Prior Publication Data
US 2009/0140265 A1 Jun. 4, 2009

(30) Foreign Application Priority Data

Dec. 3, 2007 (JP) ................... 2007-312071

(51) Int. Cl.
*H01L 33/00* (2010.01)
(52) U.S. Cl. ............ 257/80; 257/E33.078; 257/E31.096; 257/E25.032

(58) Field of Classification Search ............ 257/80, 257/59, 200, E33.076, 79.88, 84, 292, E31.096, 257/E25.032; 345/76, 204, 89, 77, 213
See application file for complete search history.

(56) References Cited

U.S. PATENT DOCUMENTS
5,753,928 A * 5/1998 Krause .......... 250/551
2007/0200971 A1* 8/2007 Koide et al. ........ 349/61

FOREIGN PATENT DOCUMENTS
JP  A-2002-178560  6/2002
JP  A-2007-290329  11/2007

* cited by examiner

*Primary Examiner* — Thomas L Dickey
*Assistant Examiner* — Nikolay Yushin
(74) *Attorney, Agent, or Firm* — Oliff & Berridge, PLC

(57) ABSTRACT

A light emitting device includes a substrate having transparency, a light emitting element that emits light at least to the substrate side, and a light detecting element that is formed between the light emitting element and the substrate. The light detecting element is formed along an outer frame of the light emitting element in a plan view.

14 Claims, 7 Drawing Sheets

LIGHT EMITTING DEVICE AND ELECTRONIC APPARATUS

BACKGROUND

1. Technical Field

The present invention relates to a light emitting device and an electronic apparatus.

2. Related Art

As one of image forming apparatuses such as printers and facsimiles, a device that uses a light emitting device as an exposure head has been known. As the light emitting device, for example, an organic EL (Electro Luminescence) device having light emitting elements disposed so as to form a row can be used. In such a case, it is preferable that the intensity of light emitted from the light emitting elements is uniform.

In JP-A-2007-290329 and JP-A-2002-178560, technology in which a light detecting element for detecting light emitted from a light emitting device is disposed in a light emitting device and the intensity of light emitted from the light emitting element is corrected to a predetermined value based on the result of detection by using the light detecting element has been disclosed. Between these, in JP-A-2007-290329, a configuration in which the light detecting element is disposed to be partially overlapped with the light emitting element is described. In addition, in JP-A2002-178560, a configuration in which the light detecting element is disposed to be partially overlapped with the light emitting element in a plan view is described.

However, under the configuration in which the light detecting element is disposed to be overlapped with the light emitting element, there is a problem that the intensity of light output from the light emitting device decreases. In addition, under the configuration in which the light detecting element is disposed to be partially overlapped with the light emitting element in a plan view, the shape of light emitted from the light emitting device through the light detecting element becomes different from that from the light emitting device. Thus, there is a problem that deterioration of characteristics such as a decrease in the resolution occurs due to asymmetry of the shape of the light emitting area.

SUMMARY

An advantage of some aspects of the invention is that it provides a light emitting device and an electronic apparatus capable of detecting the light intensity of a light emitting element without disturbing the shape of light emission of the light emitting element. The invention may be implemented as the following forms or application examples.

Application Example 1

According to application example 1, there is provided a light emitting device including: a substrate having transparency; a light emitting element that emits light at least to the substrate side; and a light detecting element that is formed between the light emitting element and the substrate. The light detecting element is formed along an outer frame of the light emitting element in a plan view.

Under such a configuration, a part of light emitted from the light emitting element can be absorbed by the light detecting element for detection. Here, since the light detecting element absorbing light is disposed along the outer frame of the light emitting element in a plan view, light emitted from the center of the light emitting element is not absorbed by the light detecting element and is effectively used. In addition, under the above-described disposition, the shape of light that is not absorbed by the light detecting element and passes through the light detecting element can be maintained to be approximately the same shape as that of the light emitting element. In addition, light, which is generated near the outer frame of the light emitting element, from the low-luminance light emitting area having low luminance efficiency can be shielded by the light detecting element. Accordingly, the distribution of luminance of light emitted from light emitting elements can be formed uniformly. Here, a "plan view" represents a view in a direction of a normal line of the substrate.

Application Example 2

According to application example 2, in the above-described light emitting device, the light detecting element is configured to include a pin diode having a p-type semiconductor layer, a sensitivity area, and an n-type semiconductor layer, the sensitivity area is formed along the outer frame in an area including the outer frame of the light emitting element in a plan view, the p-type semiconductor layer is formed in an area not overlapped with the light emitting element in a plan view, and the n-type semiconductor layer is formed in an area not overlapped with the light emitting element in a plan view and is formed on a side opposite to the p-type semiconductor layer through the light emitting element.

Under such a configuration, the sensitivity area is also disposed in an area overlapped with the light emitting element in a plan view, and accordingly, the light emitted from the light emitting element can be easily incident to the sensitivity area. Therefore, the sensitivity of the light detecting element can increase. In addition, by forming the p-type semiconductor layer and the n-type semiconductor layer in an area not overlapped with the light emitting element, a decrease of the effective light emitting area of the light emitting element can be suppressed to a minimum level. Here, the "sensitivity area" is not limited to an area in which an impurity is not introduced and may be an area in which a very small amount of impurities having light receiving sensitivity is introduced.

Application Example 3

According to application example 3, in the above-described light emitting device, the light detecting element is configured to include a pin diode having a p-type semiconductor layer, a sensitivity area, and an n-type semiconductor layer, one layer between the p-type semiconductor layer and the n-type semiconductor layer is formed along the outer frame of the light emitting element in an area overlapped with the light emitting element in a plan view, the other layer between the p-type semiconductor layer and the n-type semiconductor layer is formed along the outer frame of the light emitting element in an area not overlapped with the light emitting element in a plan view, and the sensitivity area is formed along the outer frame in an area including the outer frame of the light emitting element in a plan view.

Under such a configuration, the p-type semiconductor layer and the n-type semiconductor layer are brought to face each other through the outer frame of the light emitting element. Thus, the p-type semiconductor layer and the n-type semiconductor layer can be disposed to be close to each other, and accordingly, carriers generated at a time when the light is received can be converted into a current with excellent efficiency.

Application Example 4

According to application example 4, in the above-described light emitting device, one layer, which is formed in the area not overlapped with the light emitting element in a plan view, between the p-type semiconductor layer and the n-type semiconductor layer is connected to a wiring that is disposed on the light emitting layer side relative to the one layer through a contact area that is formed in an area along the outer frame of the light emitting element in a plan view.

Under such a configuration, a contact area having a wall shape along the outer frame of the light emitting element is disposed on the light projecting side of the light emitting element. Thus, light emitted in a direction other than a predetermined projection direction from the light emitting element can be reflected from a member disposed in a contact area to be used effectively. Therefore, the use efficiency of light emitted from the light emitting element can increase.

Application Example 5

According to application example 5, in the above-described light emitting device, the sensitivity area is disposed between the p-type semiconductor layer and the n-type semiconductor layer, and a length between the p-type semiconductor layer and the n-type semiconductor layer is fixed.

Under such a configuration, the sensitivities of the light detecting element at each point can be configured to be uniform.

Application Example 6

According to application example 6, in the above-described light emitting device, the one layer, which is formed in the area overlapped with the light emitting element in a plan view, between the p-type semiconductor layer and the n-type semiconductor layer is connected to a wiring through a contact hole in an area not overlapped with the light emitting element in a plan view.

Under such a configuration, a problem that the effective light emitting area of the light emitting element decreases due to a contact area between the p-type semiconductor layer or the n-type semiconductor layer and a wiring can be suppressed.

Application Example 7

According to application example 7, in the above-described light emitting device, the light detecting element is formed on the outer side of the light emitting element in a plan view, and the outer frame of the light emitting element and a part of an outer frame of the light detecting element coincides with each other in a plan view.

Under such a configuration, light, which is generated near the outer frame of the light emitting element, from the low-luminance light emitting area having low luminance efficiency can be shielded by the light detecting element. Accordingly, the distribution of luminance of light emitted from the light emitting elements can be formed uniformly.

Application Example 8

According to application example 8, in the above-described light emitting device, the light detecting element is formed continuously over the entire periphery of the outer frame of the light emitting element along the outer frame of the light emitting element in a plan view.

Under such a configuration, the shape of light that is not absorbed by the light detecting element and passes through the light detecting element can be maintained to be approximately the same as that of the light emitting element. In addition, light, which is generated near the outer frame of the light emitting element, from the low-luminance light emitting area having low luminance efficiency can be shielded over the entire periphery by the light detecting element. Accordingly, the distribution of luminance of light emitted from the light emitting elements can be formed more uniformly.

Application Example 9

According to application example 9, the above-described light emitting device further includes a thin film transistor element that is formed between the substrate and the light emitting element and drives the light emitting element, wherein the light detecting element is formed in a same layer as a layer of an active element of the thin film transistor element.

Under such a configuration, the thin film transistor element that drives the light emitting element and the light detecting element can be manufactured by a common process. Accordingly, the manufacturing process of the light emitting device can be simplified.

Application Example 10

According to application example 10, there is provided an electronic apparatus having the above-described light emitting device.

Under such a configuration, image formation or image display with high image quality can be performed by using the light emitting device having the high-quality light emitting characteristic.

BRIEF DESCRIPTION OF THE DRAWINGS

The invention will be described with reference to the accompanying drawings, wherein like numbers reference like elements.

FIG. 4A is a plan view, and FIG. 4B is a cross-section view taken along line IVB-IVB shown in FIG. 4A.

FIG. 5A is a plan view, and FIG. 5B is a cross-section view taken along line VB-VB shown in FIG. 5A.

FIG. 6A is a plan view, and FIG. 6B is a cross-section view taken along line VIB-VIB shown in FIG. 6A.

DESCRIPTION OF EXEMPLARY EMBODIMENTS

Figure 1:
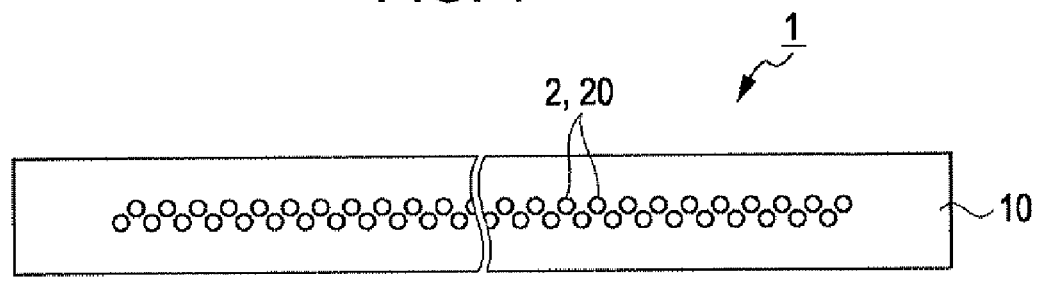
FIG. 1 is a plan view of an organic EL device according to an embodiment of the invention.

Hereinafter, a light emitting device and an electronic apparatus according to embodiments of the invention will be described with reference to the accompanying drawings. In drawings represented below, in order to represent constituent elements in sizes recognizable in the drawings, measures and scales of the constituent elements are appropriately changed.

First Embodiment

FIG. 1 is a plan view of an organic EL device 1 as a light emitting device. The organic EL device 1 is configured to have a substrate 10 having transparency as a base body. The organic EL device 1 has a plurality of light emitting elements 2 that are formed to form a row on the substrate 10. Each light emitting element 2 is electrically connected to a drain of a thin film transistor (hereinafter, abbreviated as a TFT) element 30 (FIG. 3B) and emits light having light intensity corresponding to the magnitude of a current flowing through the TFT element 30. To a gate of the TFT element 30, a first capacitor element (not shown) is electrically connected.

In addition, on the substrate 10, a light detecting element 20 is formed near each light emitting element 2. The light detecting element 20 is configured to include a pin diode having a p-type semiconductor layer 22, a sensitivity area 24, and an n-type semiconductor layer 26 (FIG. 3). In addition, the light detecting element 20 has a second capacitor element (not shown) that is electrically connected to the pin diode.

Figure 2:
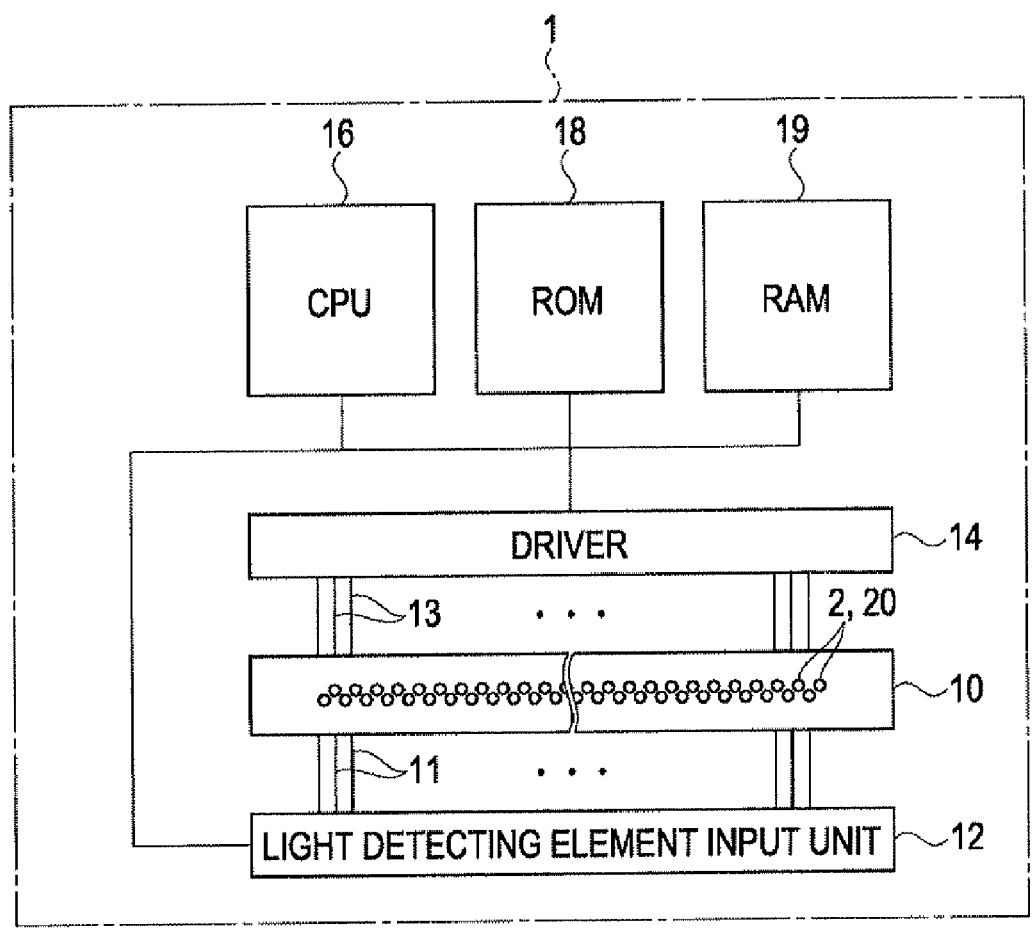
FIG. 2 is a block diagram showing the circuit configuration of an organic EL device according to an embodiment of the invention.

FIG. 2 is a block diagram showing the circuit configuration of the organic EL device 1. The organic EL device 1 includes the substrate 10 having the above-described light emitting elements 2, a light detecting element input unit 12, a driver 14 that drives the light emitting elements 2, a CPU 16 that controls the overall operation of the organic EL device 1, and a ROM 18 and a RAM 19 that store an operating program of the organic EL device 1, various types of data, or the like. Among these, the light detecting element input unit 12 is electrically connected to the light detecting elements 20 through wirings 11 and receives detection signals from the light detecting elements 20. The driver 14 is electrically connected to the light emitting elements 2 through wirings 13.

The above-described organic EL device 1 can perform an operation for controlling light intensity as below. This operation is performed based on a program stored in the ROM 18 in accordance with a direction of the CPU 16.

First, in a first process, one light emitting element 2 emits light. This process is performed by flowing a predetermined current into one of the light emitting elements 2 through the TFT element 30 (FIG. 3B) by the operation of the driver 14. The light emitting element 2 emits light having luminance corresponding to the magnitude of a current flowing through it. The current flowing through the TFT element 30 is controlled in accordance with the electric potential of a terminal of the first capacitor element that is connected to the gate of the TFT element 30. In other words, the current flowing through the TFT element 30 is controlled in accordance with the amount of charges accumulated in the first capacitor element.

In a subsequent second process, the intensity of light is detected by the light detecting element 20 that is disposed near the light emitting element 2 that emits light in the first process. In particular, electron-hole pairs are generated by light incident to the sensitivity area 24 (FIG. 3) of the pin diode of the light emitting element 20. Accordingly, the electrical conductivity of the sensitivity area 24 changes, and charges accumulated in the second capacitor element that is connected to the pin diode are discharged through the pin diode in accordance with the change. Thereafter, the second capacitor element is recharged. At this moment, a current flowing in the second capacitor element is detected by the light detecting element input unit 12. The light intensity of the light emitting element 2 can be acquired based on the magnitude of the detected signal at that moment.

In a subsequent third process, a voltage to be written into the first capacitor element of the light emitting element 2 is corrected in accordance with the result of detection acquired by the light detecting element input unit 12 and the value of a detected signal, which is measured in advance, for a case where the light emitting element 2 is configured to emit light at predetermined light intensity. Accordingly, the light intensity from the light emitting element 2 can be controlled at a predetermined value.

By sequentially performing the first process to the third process for all the light emitting elements 2, the light intensities of the light emitting elements 2 can be made to be uniform.

Figure 3A:
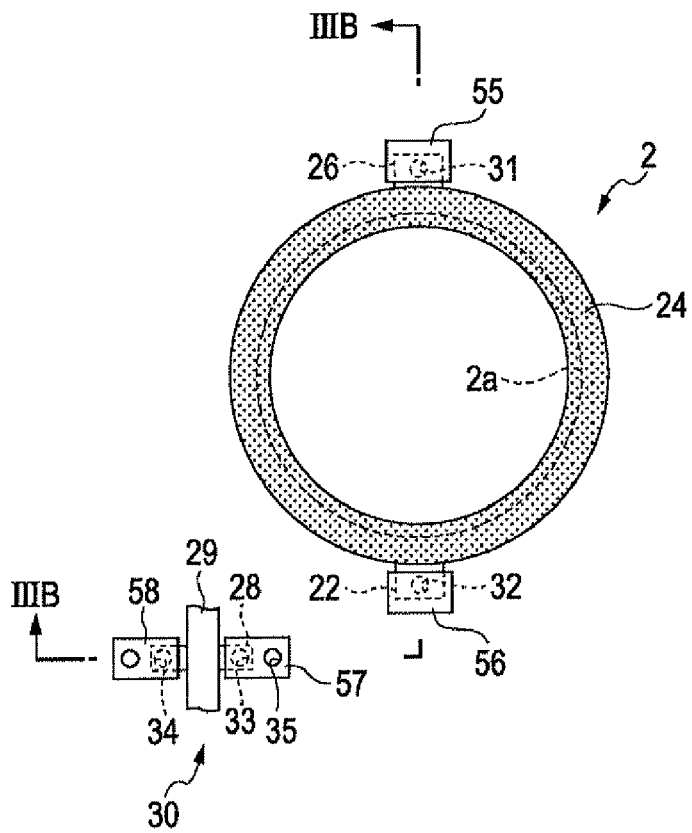
FIG. 3A is a plan view of a light emitting element and a light detecting element according to an embodiment of the invention.
Figure 3B:
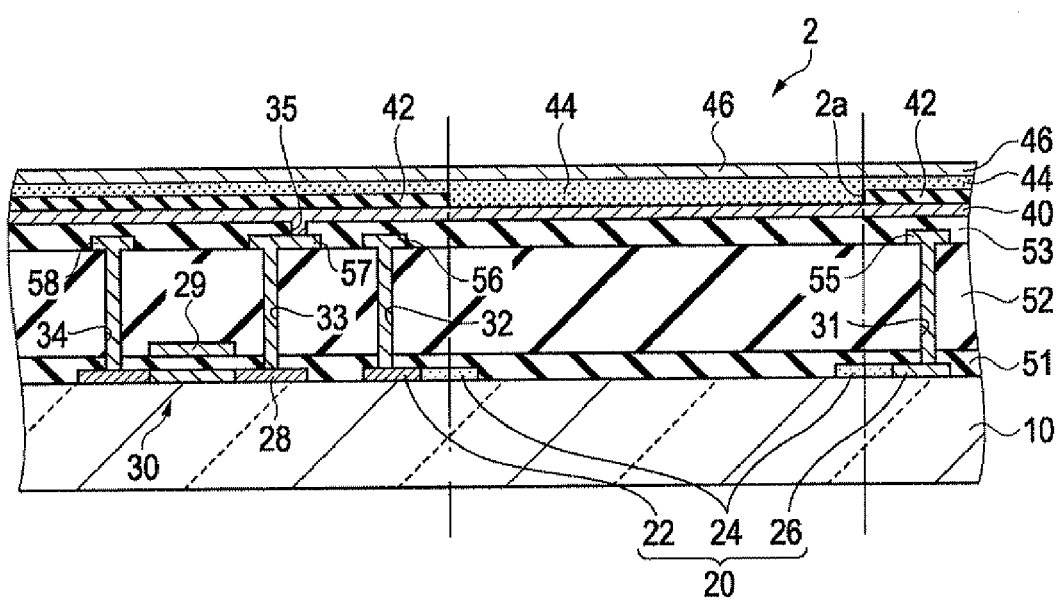
FIG. 3B is a cross-section view taken along line IIIB-IIIB shown in FIG. 3A.

Subsequently, detailed configurations of the light emitting element 2 and the light detecting element 20 will be described with reference to FIGS. 3A and 3B. FIG. 3A is a plan view of the light emitting element 2 and the light detecting element 20. FIG. 3B is a cross-section view taken along line IIIB-IIIB shown in FIG. 3A.

As shown in FIG. 3A, the light emitting element 2 has a circular opening part (light emitting part), and the outer frame 2a of the light emitting element has a circular shape. The light detecting element 20 is formed to be continuous over the whole circumference in a plan view along the outer frame 2a of the light emitting element 2. In particular, the light detecting element 20 is configured to include a pin diode having a p-type semiconductor layer 22, a sensitivity area 24, and an n-type semiconductor layer 26. In this embodiment, the sensitivity area 24 is formed in an area including the outer frame 2a of the light emitting element 2 in a plan view along the outer frame 2a. In other words, the sensitivity area 24 is formed in a circular pattern along the outer frame 2a. Here, "the area including the outer frame 2a" means an area over the inner side of the light emitting element 2 to the outer side with the outer frame 2a interposed therebetween. The p-type semiconductor layer 22 and the n-type semiconductor layer 26 are formed in an area not overlapped with the light emitting element 2 in a plan view. The n-type semiconductor layer 26 is formed on a side opposite to the p-type semiconductor layer 22 with the light emitting element 2 interposed therebetween. Accordingly, a decrease in an effective light emitting area of the light emitting element 2 can be suppressed to a minimum level.

Next, the cross-section structures of the light emitting element 2 and the light detecting element 20 will be described with reference to FIG. 3B. On the substrate 10, which has transparency, formed of a glass substrate, a quartz substrate, or the like, an active element 28 of the TFT element 30 and the p-type semiconductor layer 22, the sensitivity area 24, and the n-type semiconductor 26 layer of the light detecting element 20 are formed. Hereinafter, these elements formed on the substrate 10 in aggregate are also referred to as a "first layer". Each element of the first layer, for example, may be configured by using polysilicon and is formed with impurities doped therein as is needed. Under such a configuration, the semiconductor layers of the TFT element 30 and the light detecting element 20 can be produced by performing a common process. Accordingly, the manufacturing process of the organic EL device 1 can be simplified.

On the first layer, a gate line 29 is laminated with a gate insulating layer 51, which is formed of silicon oxide or the like, interposed therebetween. The gate line 29 is formed to be partially overlapped with the active element 28 in a plan view. An area of the active element 28 which faces the gate line 29 becomes a channel region of the TFT element 30.

On the gate line 29, relay electrodes 55, 56, 57, and 58 are formed through an interlayer insulation layer 52 formed of silicon oxide or the like. The relay electrodes 55, 56, 57, and 58, for example, are formed of aluminum. The relay electrode 55 is electrically connected to the n-type semiconductor layer 26 through a contact hole 31 that is formed by perforating the gate insulating layer 51 and the interlayer insulation layer 52. In addition, the relay electrode 56 is electrically connected to the p-type semiconductor layer 22 through a contact hole 32 that is formed by perforating the gate insulating layer 51 and the interlayer insulation layer 52. The relay electrodes 55 and 56 are connected to both electrodes of the second capacitor element. In addition, the relay electrodes 55 and 56 configure terminals of the light detecting element 20 and are connected to wirings. The light detecting element 20 is configured by the relay electrodes 55 and 56, the p-type semiconductor layer 22, the sensitivity area 24, and the n-type semiconductor layer 26. In addition, the contact holes 31 and 32 are disposed in an area not overlapped with the light emitting element 2 in a plan view. Accordingly, a problem that the effective light emitting area of the light emitting element 2 decreases due to a contact area can be suppressed.

The relay electrode 57 is electrically connected to the drain of the TFT element 30 through a contact hole 33 that is formed by perforating the gate insulating layer 51 and the interlayer insulation layer 52. In addition, the relay electrode 58 is electrically connected to the source of the TFT element 30 through a contact hole 34 that is formed by perforating the gate insulating layer 51 and the interlayer insulation layer 52.

On the relay electrodes 55, 56, 57, and 58, a pixel electrode 40 as an anode of the light emitting element 2 is laminated through an interlayer insulation layer 53 that is formed of silicon oxide or the like. The pixel electrode 40 is formed to be independent for each light emitting element 2 and, for example, is formed of ITO (Indium Tin Oxide) having transparency. In addition, the pixel electrode 40 is electrically connected to the relay electrode 57 through a contract hole 35 that is formed in the interlayer insulation layer 53.

On the pixel electrode 40, a light emission control layer 42 formed of silicon oxide is formed. On the light emission control layer 42, a light emitting layer 44 is laminated over the approximately entire face of the substrate 10. In addition, on the light emitting layer 44, a cathode 46 is formed over the approximately entire face of the substrate 10. The cathode 46, for example, is formed by laminating calcium and aluminum in the described order. The cathode 46 has a function as a reflective layer, additionally.

The light emission control layer 42 is formed to have an opening in an area overlapped with the light emitting element 2 in a plan view. The light emission control layer 42 is an insulation layer, and thus, an electric field that is generated between the pixel electrode 40 and the cathode 46 is blocked in an area in which the light emission control layer 42 is disposed in a plan view. Accordingly, a current does not flow through the light emitting layer 44 basically, so that the light emitting layer 44 does not emit light. In other words, light emission is performed by the light emitting layer 44 only in an area in which the light emission control layer 42 is not disposed. As a result, the opening part of the light emission control layer 42 regulates the outer shape of the light emitting element 2, and thus, an edge of the opening part of the light emission control layer 42 becomes the outer frame 2a of the light emitting element 2.

The light emitting layer 44 is a layer of an organic light emitting material that exhibits an electroluminescence phenomenon. By applying a voltage between the pixel electrode 40 and the cathode 46, holes from the pixel electrode 40 side and electrons from the cathode 46 side are injected into the light emitting layer 44. The light emitting layer 44 emits light at a time when the holes and electrons are combined together. The light emission spectrum of the light emitting layer 44 depends on the light emission characteristic of the material or the film thickness. In the light emitting layer 44, a hole transport layer, a hole injecting layer, a hole blocking layer, an electron transport layer, an electron injecting layer, an electron blocking layer, and the like may be included.

The light projected to the substrate 10 side from the light emitting layer 44 is directly transmitted through the substrate 10. In addition, the light projected to the cathode 46 side from the light emitting layer 44 is reflected by the cathode 46, then progresses to the substrate 10 side, and is transmitted through the substrate 10, similarly. As described above, a configuration of the organic EL device 1 in which light is projected to the substrate 10 side is called a bottom emission type.

In descriptions here, the light emitting element 2 is defined as below. The light emitting element 2 is configured to include the pixel electrode 40, the cathode 46, and the light emitting layer 44 disposed between the pixel electrode 40 and the cathode 46, and an area surrounded by the light emission control layer 42 becomes the area viewed in a plane. Accordingly, the light detecting element 20 that is configured to include the p-type semiconductor layer 22, the sensitivity area 24, and the n-type semiconductor layer 26 of the first layer is formed in a layer disposed between the light emitting element 2 and the substrate 10.

In the above-described configuration, since the light emitting element 2 and the sensitivity area 24 of the light detecting element 20 are partially overlapped with each other in a plan view, a part of light emitted from the light emitting element 2 can be effectively absorbed and detected by the light detecting element 20. In other words, the sensitivity of the light detecting element 20 can be increased.

Here, the sensitivity area 24 has a light shielding property corresponding to the thickness thereof and serves as a light shielding layer. The sensitivity area 24 is disposed along the outer frame 2a of the light emitting element 2 in a plan view and is not disposed in a center part of the light emitting element 2. Accordingly, light emitted from the center of the light emitting element 2 is not absorbed by the sensitivity area 24 and is used effectively. As a result, a problem that the intensity of light output from the organic EL device 1 decreases can be suppressed. Thus, the light emitting element 2 is not needed to be driven for an output higher than is required, and therefore, the durability of the organic EL device 1 can be improved.

In addition, by disposing the light detecting element 20 (the sensitivity area 24) along the outer frame 2a of the light emitting element 2 in a plan view, the shape of passing light without being absorbed by the light detecting element 20 can be maintained to be in an approximately same shape as that of the light emitting element 2.

According to this embodiment, one light detecting element 20 is formed for each one light emitting element 2, and accordingly, the light intensity of light emission of each light emitting element 2 can be precisely detected with high sensitivity. In addition, since the organic EL device 1 does not have any dummy light emitting element for detection other than the light emitting element 2 that is actually used, the symmetry of arrangement of the light emitting elements 2 can be maintained. In addition, power consumption for a dummy light emitting element that is not needed for actual use can be curtailed, and thus, a light shielding layer used for preventing external leakage of light from the dummy light emitting element is not required.

In addition, for example, the organic EL device 1 may be a top emission type in which light is emitted toward a side opposite to the substrate 10 as long as it has a configuration in which light is output from the light emitting element 2 to at least the substrate 10 side (that is, the light detecting element 20 side). In such a case, the cathode 46, for example, is formed of a thin film of MgAg so as to have optical transparency, and a light reflecting layer formed of aluminum or the like is formed in a layer below the pixel electrode 40. In such a case, in order to input a part of light emitted from the light emitting element 2 to the light detecting element 20r it is preferable to form an opening in a part of the light reflecting layer.

Second Embodiment

Subsequently, a second embodiment of the invention will be described. According to this embodiment, an area included in the light detecting element 20 for forming the sensitivity area 24 is different from that according to the first embodiment, and other configurations and advantages of the configurations are the same as those according to the first embodiment. Hereinafter, the second embodiment will be described with a difference between the first and second embodiments primarily focused.

Figure 4A:
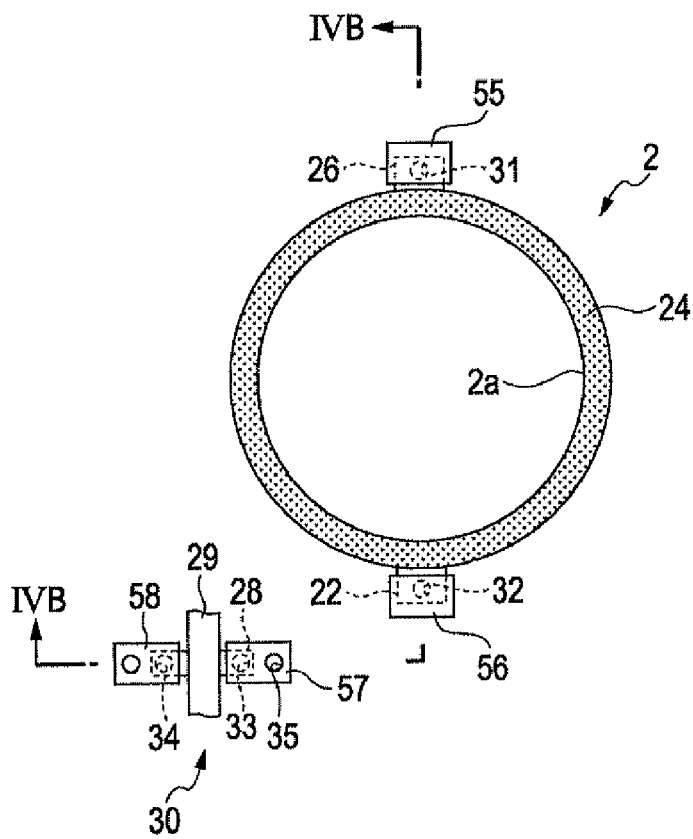
FIGS. 4A and 4B are diagrams showing a light emitting element and a light detecting element according to a second embodiment of the invention.
Figure 4B:
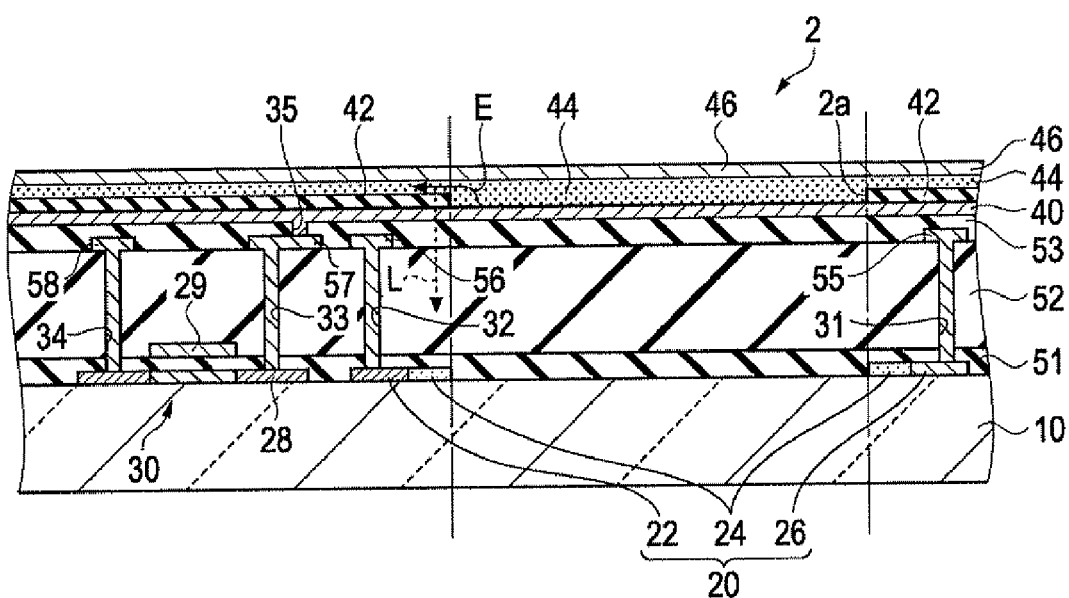

FIGS. 4A and 4B are diagrams showing a light emitting element 2 and a light detecting element 20 according to the second embodiment. FIG. 4A is a plan view, and FIG. 4B is a cross-section view taken along line IVB-IVB shown in FIG. 4A. As shown in FIG. 4A, in this embodiment, the light detecting element 20 is formed on an outer side of the light emitting element 2 in a plan view, and the outer frame 2a of the light emitting element 2 coincides with a part of the outer frame of the light detecting element 20 in a plan view. In particular, the sensitivity area 24 of the light detecting element 20 is formed in a circular shape so as to surround the outer frame 2a of the light emitting element 2 and be brought into contact with the outer frame 2a.

Under such a configuration, light from a low-luminance light emitting area having low luminance efficiency which is generated near the outer frame 2a of the light emitting element 2 can be shielded by the light detecting element 20. Here, the reason why the low-luminance light emitting area is formed near the outer frame 2a of the light emitting element 2 will be described. The electric field generated between the pixel electrode 40 and the cathode 46 is basically blocked by the light emission control layer 42. However, as shown in FIG. 4B, a part of the electric field E leaks into an area in which the light emission control layer 42 is formed. As a result, a current flows in the light emitting layer 44 located in an area, in which the light emission control layer 42 is formed, near the outer frame 2a of the light emitting element 2 so as to emit light, and accordingly, light L having low luminance is output from the area. The light L is generated by light emission from the outside of an area that is intended as a light emitting area of the light emitting element 2 and may cause problems of a decrease in the resolution and the like. Accordingly, it is preferable that the light is shielded. According to this embodiment, the light detecting element 20 (the sensitivity area 24) is formed in the direction of projection of the light L and thus, the light L can be absorbed and shielded by the light detecting element. Accordingly, a light emitting area of the light emitting element 2 can be arranged in a desired area by shielding unnecessary light leakage. In addition, since the light from the low-luminance light emitting is shielded, the distribution of luminance of light emitted from the light emitting element 2 can be formed to be uniform.

Third Embodiment

Subsequently, a third embodiment of the invention will be described. In this embodiment, areas for forming the p-type semiconductor layer 22 and the n-type semiconductor layer 26 of the light detecting element 20 are different from those of the first embodiment, and other configurations and advantages of the configurations are the same as those according to the first embodiment. Hereinafter, the third embodiment will be described with a difference between the first and third embodiments primarily focused.

Figure 5A:
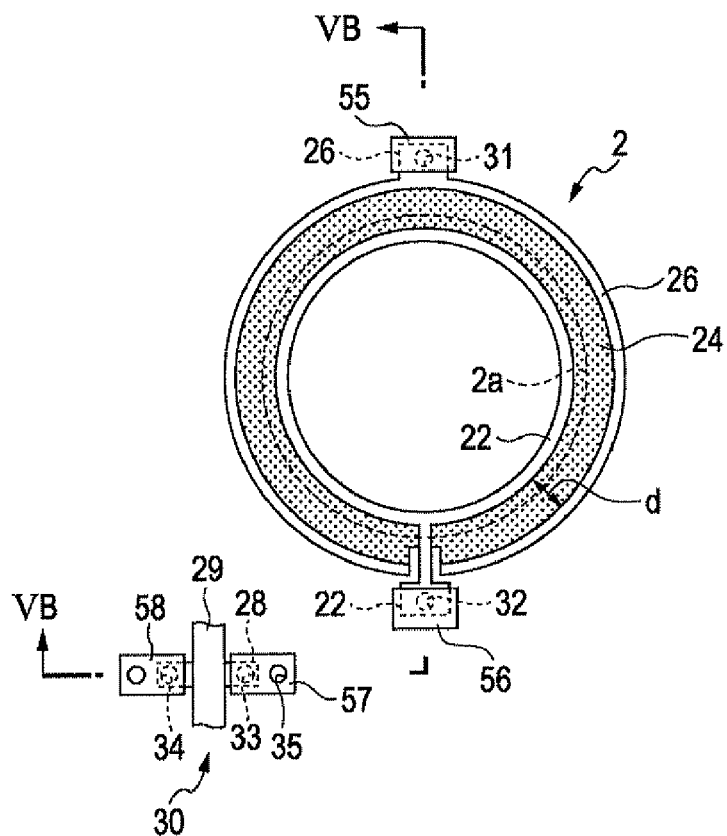
FIGS. 5A and 5B are diagrams showing a light emitting element and a light detecting element according to a third embodiment of the invention.
Figure 5B:
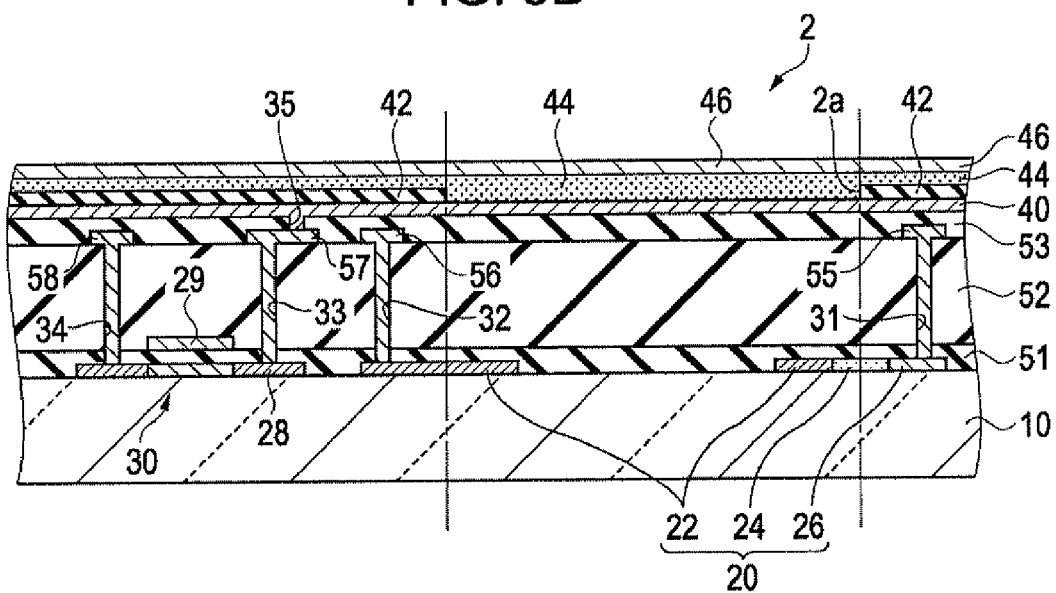

FIGS. 5A and 5B are diagrams showing a light emitting element 2 and a light detecting element 20 according to the third embodiment. FIG. 5A is a plan view, and FIG. 5B is a cross-section view taken along line VB-VB shown in FIG. 5A. As shown in FIG. 5A, in this embodiment, the p-type semiconductor layer 22 of the light detecting element 20 is formed along the outer frame 2a of the light emitting element 2 in an area overlapped with the light emitting element 2 in a plan view, and the n-type semiconductor layer 26 of the light detecting element is formed along the outer frame 2a of the light emitting element 2 in an area not overlapped with the light emitting element 2 in a plan view. In addition, the sensitivity area 24 is formed along the outer frame 2a in an area including the outer frame 2a of the light emitting element 2 in a plan view.

In particular, the p-type semiconductor layer 22 has a toric-shaped part that is formed on the inner side of the outer frame 2a of the light emitting element 2 and is drawn from the toric-shaped part to the outside of the light emitting element 2 to be electrically connected to the relay electrode 55 and a prior wiring thereof through the contact hole 31. Under the above-described configuration in which the p-type semiconductor layer 22 formed in an area overlapped with the light emitting element 2 in a plan view is connected to the wiring through the contact hole 31 in an area not overlapped with the light emitting element 2 in a plan view, a problem that the effective light emitting area of the light emitting element 2 decreases due to a contact area can be suppressed. In addition, the n-type semiconductor layer 26 has a toric-shaped part partly cut out which is formed on the outer side of the outer frame 2a of the light emitting element 2 and is electrically connected to the relay electrode 56 and a prior wiring thereof though the contact hole 32 in a convex part that is disposed on the toric-shaped part. The sensitivity area 24 is disposed in an area that is interposed between the p-type semiconductor layer 22 and the n-type semiconductor layer 26.

Under such a configuration, the p-type semiconductor layer 22 and the n-type semiconductor layer 26 face each other with the outer frame 2a of the light emitting element 2 interposed therebetween. Thus, the p-type semiconductor layer 22 and the n-type semiconductor layer 26 can be disposed to be close to each other, and accordingly, carriers generated at time when light is received can be efficiently converted into a current. In addition, a length (that is, the width of the sensitivity area 24) between the p-type semiconductor layer 22 and the n-type semiconductor layer 26 is fixed at the parts, and accordingly, the sensitivity at points of the light detecting element 20 can be uniform.

In addition, it is configured that one between the p-type semiconductor layer 22 and the n-type semiconductor 26 is disposed in an area overlapped with the light emitting element 2 and the other is disposed in an area not overlapped with the light emitting element 2. For example, the above-described disposition position of the p-type semiconductor layer 22 and the n-type semiconductor layer 26 may be reversed. Thus, it may be configured that the p-type semiconductor layer 22 is formed on the outer side of the light emitting element 2 and the n-type semiconductor layer 26 is formed on the inner side of the light emitting element 2.

Fourth Embodiment

Subsequently, a fourth embodiment of the invention will be described. In this embodiment, a part of the configuration of the light detecting element 20 is different from that of the third embodiment, and other configurations and advantages of the configurations are the same as those according to the third embodiment. Hereinafter, the fourth embodiment will be described with a difference between the third and fourth embodiments primarily focused.

Figure 6A:
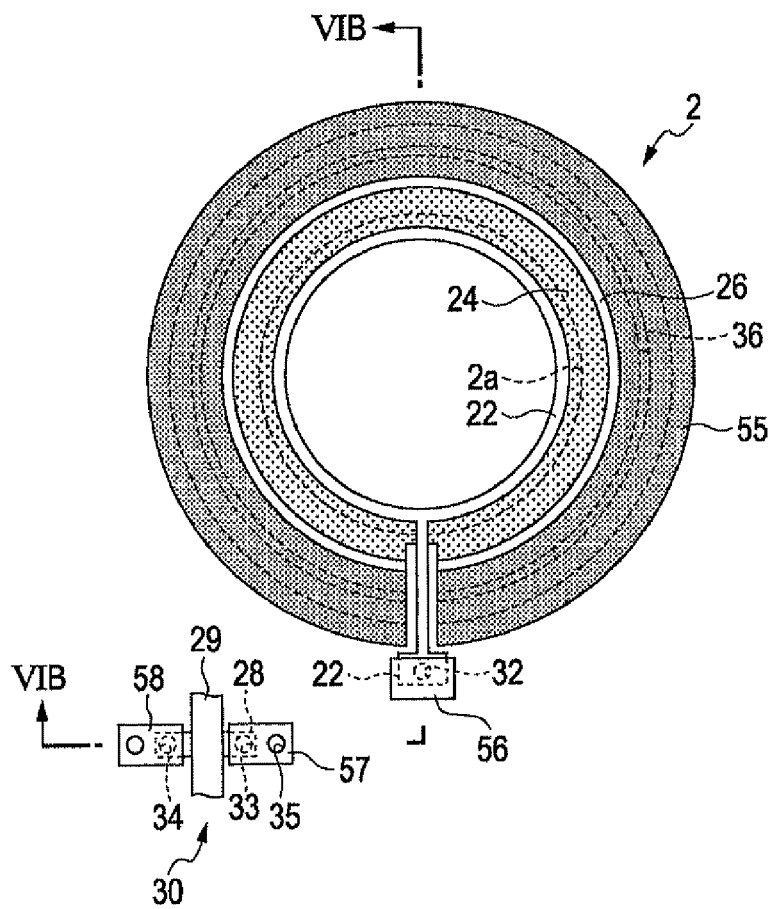
FIGS. 6A and 6B are diagrams showing a light emitting element and a light detecting element according to a fourth embodiment of the invention.
Figure 6B:
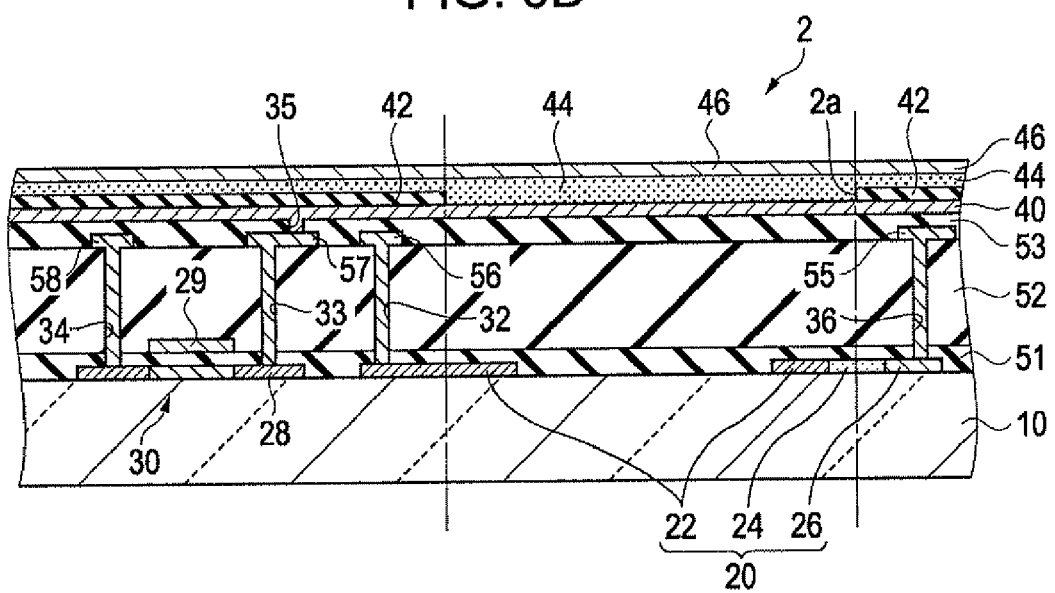

FIGS. 6A and 6B are diagrams showing a light emitting element 2 and a light detecting element 20 according to the fourth embodiment. FIG. 6A is a plan view, and FIG. 6B is a cross-section view taken along line VIB-VIB shown in FIG. 6A. As shown in FIG. 6A, in this embodiment, the p-type semiconductor layer 22 of the light detecting element 20 has a toric-shaped part that is formed on the inner side of the outer frame 2a of the light emitting element 2 and is drawn from the toric-shaped part to the outside of the light emitting element 2 to be electrically connected to the relay electrode 55 and a prior wiring thereof through a contact area 36.

In addition, the n-type semiconductor layer 26 is formed in a toric-shaped area partially cut out which is formed on the outer side of the outer frame 2a of the light emitting element 2. The width of the toric-shaped part is configured to be larger than that of the toric-shaped part of the p-type semiconductor layer 22. In addition, the relay electrode 55 that is electrically connected to the n-type semiconductor layer 26 is formed in a toric-shaped area partially cut out that is partially overlapped with the toric-shaped part of the n-type semiconductor layer 26. Thus, an area in which the n-type semiconductor layer 26 and the relay electrode 55 are overlapped with each other in a plan view is also the toric-shaped area.

The n-type semiconductor layer 26 and the relay electrode 55 are electrically connected to each other through a contact area 36 that is formed in the toric-shaped area partially cut out in an area in which the n-type semiconductor layer 26 and the relay electrode 55 are overlapped with each other in a plan view. The contact area 36 is formed along the outer frame 2a of the light emitting element 2 on the outer side of the light emitting element 2 and forms an approximately tubular shaped wall that surrounds the light-emitting side area of the light emitting element 2. The wall formed by the contact area 36 is formed of a same member as that of the relay electrode 55 and, for example, is formed of aluminum. Accordingly, the light emitted from the light emitting element 2 can be reflected. As a material of the contact area 36, metal having optical reflectivity other than aluminum may be used. In addition, it is preferable that the metal having high reflectivity is used as the material of the contact area 36.

Under such a configuration, light emitted in a direction other than a predetermined emitting direction from the light emitting element 2 is reflected by the contact area 36 to be collected and effectively used. Accordingly, the use efficiency of light emitted from the light emitting element 2 can be improved.

In addition, the above-described disposition position of the p-type semiconductor layer 22 and the n-type semiconductor layer 26 may be reversed. Thus, it may be configured that the p-type semiconductor layer 22 is formed on the outer side of the light emitting element 2 and the n-type semiconductor layer 26 is formed on the inner side of the light emitting element 2. In addition, the contact area 36 is not necessarily continuous so as to surround approximately the entire periphery of the outer frame 2a of the light emitting element 2. Thus, the contact area 36 may be formed intermittently along a part of the outer frame 2a. When the contact area 36 is formed along at least a part of the outer frame 2a, a light collecting function of the contact area 36 is acquired.

Example of Mounting Organic EL Device 1 to Electronic Apparatus

Figure 7:
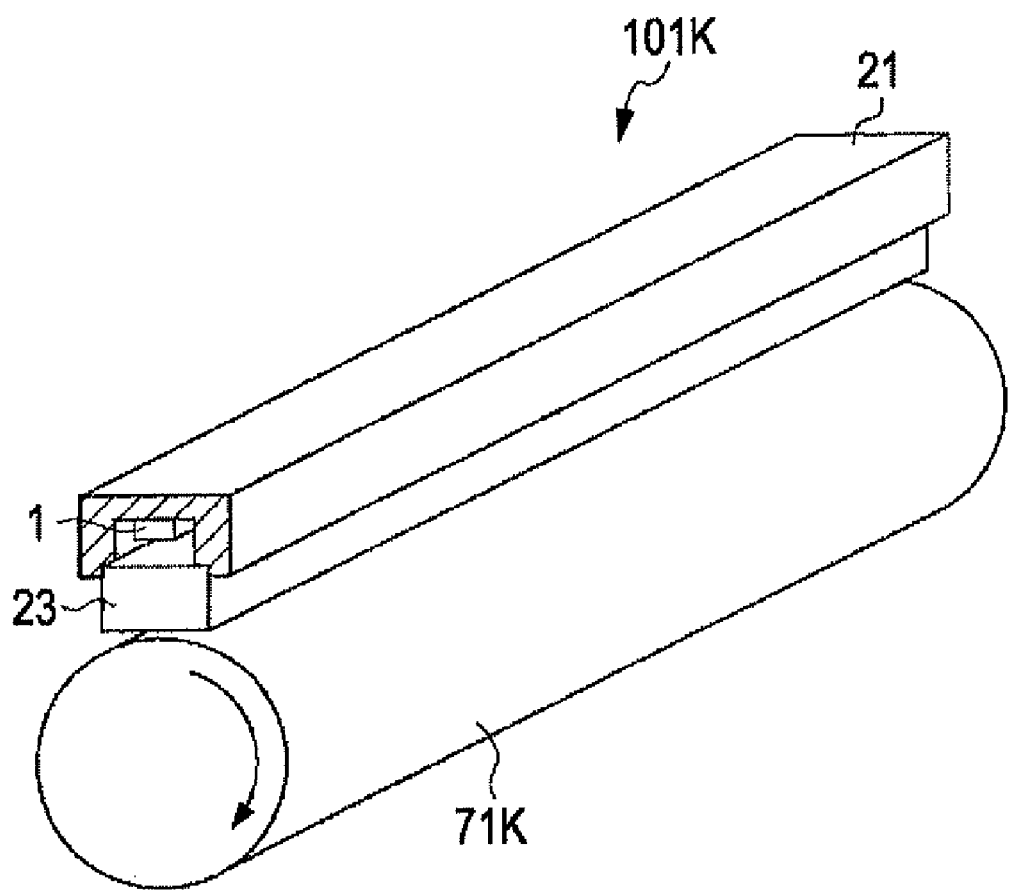
FIG. 7 is a perspective view of an optical writing head module according to an embodiment of the invention.

When the organic EL device 1 is mounted to an electronic apparatus, for example, as shown in a perspective view of FIG. 7, the organic EL device may be built in an optical writing head module 101K to be used. The optical writing head module 101K is parallel to a cylindrical photosensitive drum 71K and is used in a state to be faced with the photosensitive drum 71K. The optical writing head module 101K includes a box-shaped body 21 that is disposed in a direction parallel to the photosensitive drum 71K and an optical member 23 that is installed to the box-shaped body 21 so as to be interposed between the box-shaped body 21 and the photosensitive drum 71K. The box-shaped body 21 has an opening part on the photosensitive drum 71K side, and the organic EL device 1 is fixed such that light is projected toward the opening part. The optical member 23 includes a Selfoc (registered trademark) lens array therein, and projects light that is emitted from the light emitting element 2 of the organic EL device 1 and is incident to one end thereof from the other end and collects and projects (draws) the light on the surface of the photosensitive drum 71K.

Figure 8:
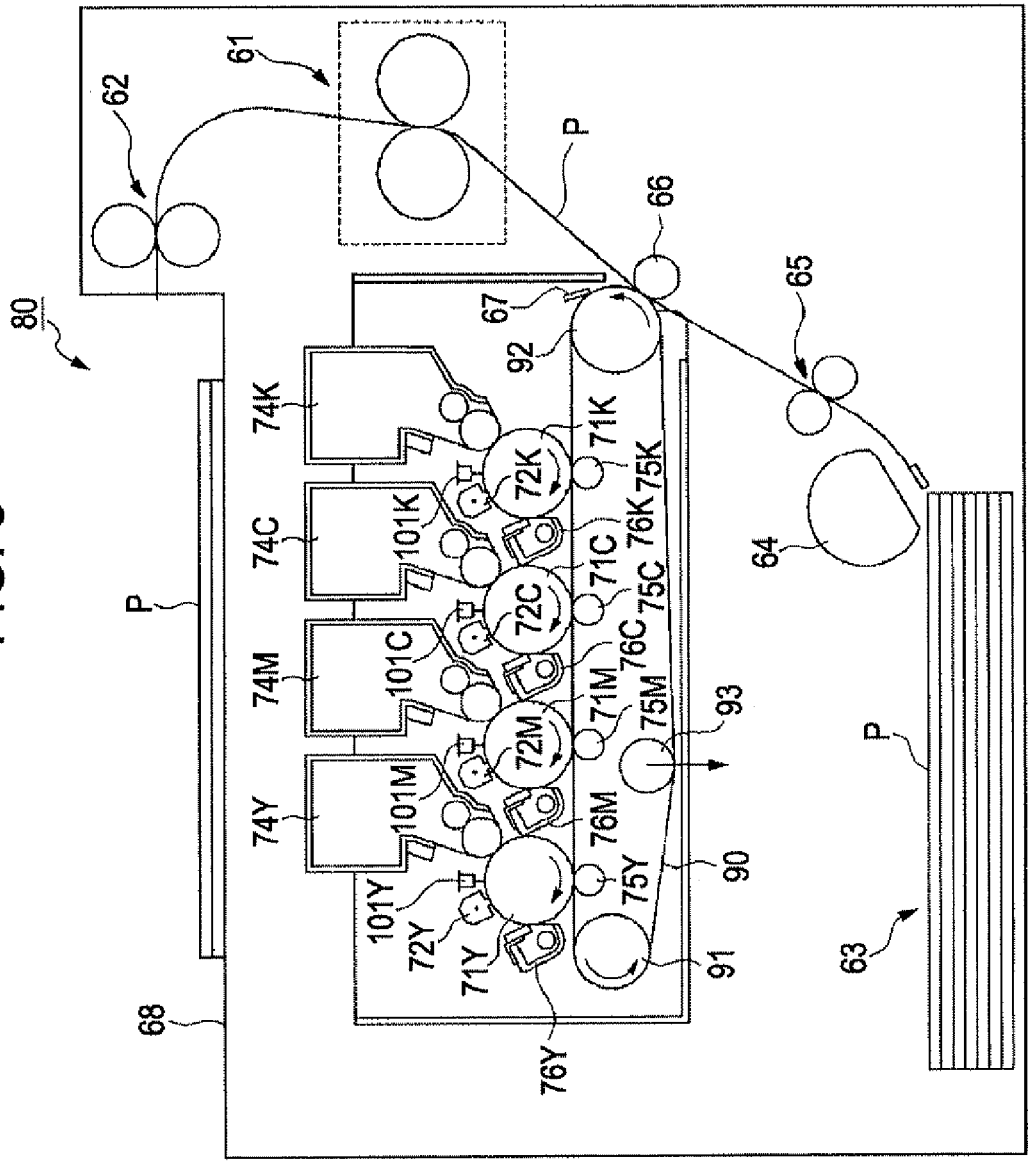
FIG. 8 is a cross-section view of an image forming apparatus as an electronic apparatus according to an embodiment of the invention.

The organic EL device 1 and the optical writing head module 101K in which the organic EL device is built is used in an image forming apparatus 80 as an electronic apparatus shown in FIG. 8. FIG. 8 is a cross-section view showing the configuration of the image forming apparatus 80.

The image forming apparatus 80 includes optical writing head modules 101K, 101C, 101M, and 101Y in which the organic EL devices 1 are built and is configured as a tandem type in which four sensitive drums (image carriers) 71K, 71C, 71M, and 71Y are disposed in correspondence with the optical writing head modules.

The image forming apparatus 80 includes a driving roller 91, a driven roller 92, and a tension roller 93. In addition, an intermediate transfer belt 90 is loaded over the above-described rollers so as to be driven circulatory in the direction (counter clockwise direction) of an arrow shown in FIG. 8. The photosensitive drums 71K, 71C, 71M, and 71Y are disposed at a predetermined interval in the intermediate transfer belt 90. The outer peripheral face of the photosensitive drums 71K, 71C, 71M, and 71Y are formed of photosensitive layers as image carriers.

Here, K, C, M, and Y included in the reference signs represent black, cyan, magenta, and yellow, and the reference signs represent black, cyan, magenta, and yellow photo sensors. The reference signs K, C, M, and Y represent the same for other members. The photosensitive drums 71K, 71C, 71M, and 71Y are configured to be rotated in the direction (clockwise direction) of the arrow shown in FIG. 8 in synchronization with driving of the intermediate transfer belt 90.

In the periphery of the photosensitive drums 71K, 71C, 71m, and 71Y, charging units (corona chargers) 72K, 72C, 72M, and 72Y that uniformly charges the outer peripheral faces of the photosensitive drums 71K, 71C, 71M, or 71Y and the optical writing head modules 101K, 101C, 101M, and 101Y sequentially line-scanning the outer peripheral faces that are uniformly charged by the charging units 72K, 72C, 72M, and 72Y in synchronization with rotation of the photosensitive drums 71K, 71C, 71M, and 71Y are disposed.

In addition, developing units 74K, 74C, 74M, and 74Y that generate visible images (toner images) by applying toner as a developer to electrostatic latent images formed by the optical writing head modules 101K, 101C, 101M, and 101Y and primary transfer rollers 75K, 75C, 75M, and 75Y as transfer units that sequentially transfer the toner images developed by the developing units 74K, 74C, 74M, and 74Y to an intermediate transfer belt 90 that is a target for primary transfer are disposed. In addition, cleaning units 76K, 76C, 76M, 76Y as units used for a cleaning operation that remove toner that remains on the surfaces of the photosensitive drums 71K, 71C, 71M, and 71Y after completion of the transfer are disposed.

The optical writing head modules 101K, 101C, 101N, and 101Y are arranged such that the direction (the direction of alignment of the light emitting elements 2) of arrangement of each organic EL device is parallel to the rotation axis of the photosensitive drum 71K, 71C, 71M, or 71Y. In addition, it is configured that major emission wavelengths of the optical writing head modules 101K, 101C, 101M, and 101Y approximately coincide with sensitivity peak wavelengths of the photosensitive drums 71K, 71C, 71M, and 71Y.

The developing units 74K, 74C, 74M, and 74Y, for example, use non-magnetic mono-composition toner. The mono-composition toner is transported to a developing roller, for example, by a supply roller, the film thickness of developer attached to the surface of the developing roller is regulated by a regulatory blade, and the developing roller is brought into contact with or pressed to the photosensitive drum 71K, 71C, 71M, or 71Y. Accordingly, the developers are attached in accordance with the levels of electric potentials of the photosensitive drums 71K, 71C, 71M, and 71Y, and thereby toner images are developed.

The toner images of black, cyan, magenta, and yellow colors that are formed by mono-color toner image forming stations of four colors are transferred primarily to the intermediate transfer belt 90 one after another in accordance with primary transfer biases applied by the primary transfer rollers 75K, 75C, 75M, and 75Y. Then, a full-color toner image generated by sequentially overlapping the toner images on the intermediate transfer belt 90 is transferred secondarily to a recording medium P such as a paper sheet P in the second transfer roller 66 and passes through a fixing roller pair 61 as a fixing unit to be fixed to the recording medium P. Thereafter, the full-color toner image is discharged to a discharge tray 68 that is formed on the upper part of the device by a discharge roller pair 62.

In addition, in FIG. 8, reference numeral 63 is a paper feeding cassette in which a plurality of recording media P is laminated and supported, reference numeral 64 is a pickup roller that feeds the recording media P one after another from the paper feeding cassette 63, and reference numeral 65 is a gate roller pair that regulates the timing of the secondary transfer roller 66 for supplying the recording medium P to a secondary transfer unit. In addition, reference numeral 66 is a secondary transfer roller as a part used for the secondary transfer that forms the secondary transfer unit between the intermediate transfer unit 90 and the secondary transfer roller, and reference numeral 67 is a cleaning blade as a cleaning unit that removes toner that remains on the surface of the transfer belt 90 after completion of the secondary transfer.

The image forming apparatus 80 includes the optical writing head modules 101K, 101C, 101M, and 101Y having the organic EL device 1 according to an embodiment of the invention as exposure units. Thus, the image forming apparatus 80 can perform high-resolution drawing without unsharpness on the photosensitive drum 71K and can perform a printing operation with high image quality. In addition, the amounts of colors of emitted light of the organic EL device 1 can be adjusted uniform by using the light detecting element 20 or the like, and accordingly, an image with the high image quality can be formed.

In addition, the organic EL device 1 may be mounted as a display device to a display unit of a cellular phone, a mobile computer, a digital camera, a digital video camera, a vehicle-mounted apparatus, an audio apparatus, or the like as an electronic apparatus.

In addition, various modifications may be added to the above-described embodiments. As a modified example, for example, the following may be considered.

Modified Example

The light detecting element 20 is not needed to be formed continuous over the entire periphery of the outer frame 2a of the light emitting element 2. In other words, a part of the light detecting element may be cut out, or the light detecting element may be disposed intermittently. In such a case, by forming the light detecting element in an area that is symmetrical with respect to a point for the center of the light emitting element 2, the symmetry of the light emitting area on the basis of the light emitting element 2 can be maintained.

What is claimed is:

1. A light emitting device comprising:
   a substrate having transparency;
   a light emitting element that emits light at least to the substrate side; and
   a light detecting element that is formed between the light emitting element and the substrate,
   wherein the light detecting element is formed along an outer frame of the light emitting element in a plan view, and
   wherein the light detecting element is formed continuously over the entire periphery of the outer frame of the light emitting element along the outer frame of the light emitting element in a plan view, and a hole exists within the light detecting element such that a center of the light detecting element is open to the light emitted by the light emitting element.

2. The light emitting device according to claim 1,
   wherein the light detecting element is configured to include a pin diode having a p-type semiconductor layer, a sensitivity area, and an n-type semiconductor layer,
   wherein the sensitivity area is formed along the outer frame in an area including the outer frame of the light emitting element in a plan view,
   wherein the p-type semiconductor layer is formed in an area not overlapped with the light emitting element in a plan view, and
   wherein the n-type semiconductor layer is formed in an area not overlapped with the light emitting element in a plan view and is formed on a side opposite to the p-type semiconductor layer through the light emitting element.

3. The light emitting device according to claim 1,
wherein the light detecting element is configured to include a pin diode having a p-type semiconductor layer, a sensitivity area, and an n-type semiconductor layer,
wherein one layer between the p-type semiconductor layer and the n-type semiconductor layer is formed along the outer frame of the light emitting element in an area overlapped with the light emitting element in a plan view,
wherein the other layer between the p-type semiconductor layer and the n-type semiconductor layer is formed along the outer frame of the light emitting element in an area not overlapped with the light emitting element in a plan view, and
wherein the sensitivity area is formed along the outer frame in an area including the outer frame of the light emitting element in a plan view.

4. The light emitting device according to claim 3,
wherein one layer, which is formed in the area not overlapped with the light emitting element in a plan view, between the p-type semiconductor layer and the n-type semiconductor layer is connected to a wiring that is disposed on the light emitting layer side relative to the one layer through a contact area that is formed in an area along the outer frame of the light emitting element in a plan view.

5. The light emitting device according to claim 3,
wherein the sensitivity area is disposed between the p-type semiconductor layer and the n-type semiconductor layer, and
wherein a length between the p-type semiconductor layer and the n-type semiconductor layer is fixed.

6. The light emitting device according to claim 3,
wherein the one layer, which is formed in the area overlapped with the light emitting element in a plan view, between the p-type semiconductor layer and the n-type semiconductor layer is connected to a wiring through a contact hole in an area not overlapped with the light emitting element in a plan view.

7. The light emitting device according to claim 1,
wherein the light detecting element is formed on the outer side of the light emitting element in a plan view, and
wherein the outer frame of the light emitting element and a part of an outer frame of the light detecting element coincides with each other in a plan view.

8. The light emitting device according to claim 1, further comprising: a thin film transistor element that is formed between the substrate and the light emitting element and drives the light emitting element,
wherein the light detecting element is formed in a same layer as a layer of an active element of the thin film transistor element.

9. An electronic apparatus having the light emitting device according to claim 1.

10. The light emitting device according to claim 1, wherein the light detecting element is configured to include a pin diode having a p-type semiconductor layer, a sensitivity area, and an n-type semiconductor layer arranged in order laterally in the plan view.

11. The light emitting device according to claim 10, wherein the hole exists within the sensitivity area.

12. The light emitting device according to claim 1, wherein the hole is a circular shaped hole.

13. The light emitting device according to claim 1, wherein the hole is filled with a gate insulating layer.

14. A light emitting device comprising:
a substrate having transparency;
a plurality of light emitting elements that each emit light at least to the substrate side; and
a plurality of light detecting elements that are formed between the plurality of light emitting elements and the substrate,
wherein one light detecting element is formed for each light emitting element, and one light detecting element is formed along an outer frame of each light emitting element in a plan view.

* * * * *